United States Patent [19]
Winkler

[11] Patent Number: 5,107,124
[45] Date of Patent: Apr. 21, 1992

[54] APPARATUS FOR MODULATING A PARTICLE BEAM INTENSITY

[75] Inventor: Dieter Winkler, Munich, Fed. Rep. of Germany

[73] Assignee: Siemens Aktiengesellschaft, Berlin and Munich, Fed. Rep. of Germany

[21] Appl. No.: 449,080

[22] Filed: Dec. 8, 1989

Related U.S. Application Data

[63] Continuation of Ser. No. 186,040, Apr. 25, 1988, abandoned.

[30] Foreign Application Priority Data

Jul. 29, 1987 [DE] Fed. Rep. of Germany ....... 3725189

[51] Int. Cl.$^5$ ................................................ H01J 3/26
[52] U.S. Cl. ................................. 250/396 R; 359/245; 359/305
[58] Field of Search .................... 250/396 R; 350/356, 350/358; 324/158 R

[56] References Cited

U.S. PATENT DOCUMENTS 4,626,690 12/1986 Todokoro et al. ............... 250/396 R

OTHER PUBLICATIONS

Feuerbaum et al., "Beam Chopper For Subnanosecond Pulses in Scanning Electron Microscopy" J. Phys. E: Sci. Instrum., vol. 11, (1978) pp. 529-532.
May et al., "Picosecond Photoelectron Scanning Electron Microscope for Noncontact Testing of Integrated Circuits", Appl. Phys. Lett., vol. 51, No. 2, (Jul. 13, 1987).
American Institute of Physics, Rev. Sci. Instrum. 56 (4), Apr. 1985, pp. 567–571.
American Institute of Physics, Rev. Sci. Instrum 49(9), Sep. 1978, pp. 1293–1299.
H. Sadorf et al. entitled "Plug-In Fast Electron Beam Chopping System", Rev. Sci. Instrum. 56 (4), Apr. 1985.
E. Wolfgang entitled "Electron Beam Testing" from Microelectronic Engineering, 4 (1986) pp. 77–106.
R. Schmidt et al., entitled "E-Beam Testing of High-Speed Electronic Devices", Microelectronic Engineering, 5 (1986) pp. 523–530.

*Primary Examiner*—Jack I. Berman
*Attorney, Agent, or Firm*—Hill, Van Santen, Steadman & Simpson

[57] ABSTRACT

An apparatus for pulsing an electron beam essentially includes two pulse generators driven by a synchronizing unit, an electronic time delay element for delaying a trigger signal generated by the synchronizing unit, and two blanking capacitors arranged between the electron source and a first condensor lens and an electron optical column of an electron beam metrological equipment. Signals of different frequencies are applied to the blanking capacitors so that one electron pulse reaches the module surface per period t of the signal being measured. The phase relationship of the electron pulses is shifted over a time range of interest with the assistance of a controllable time delay element.

16 Claims, 3 Drawing Sheets

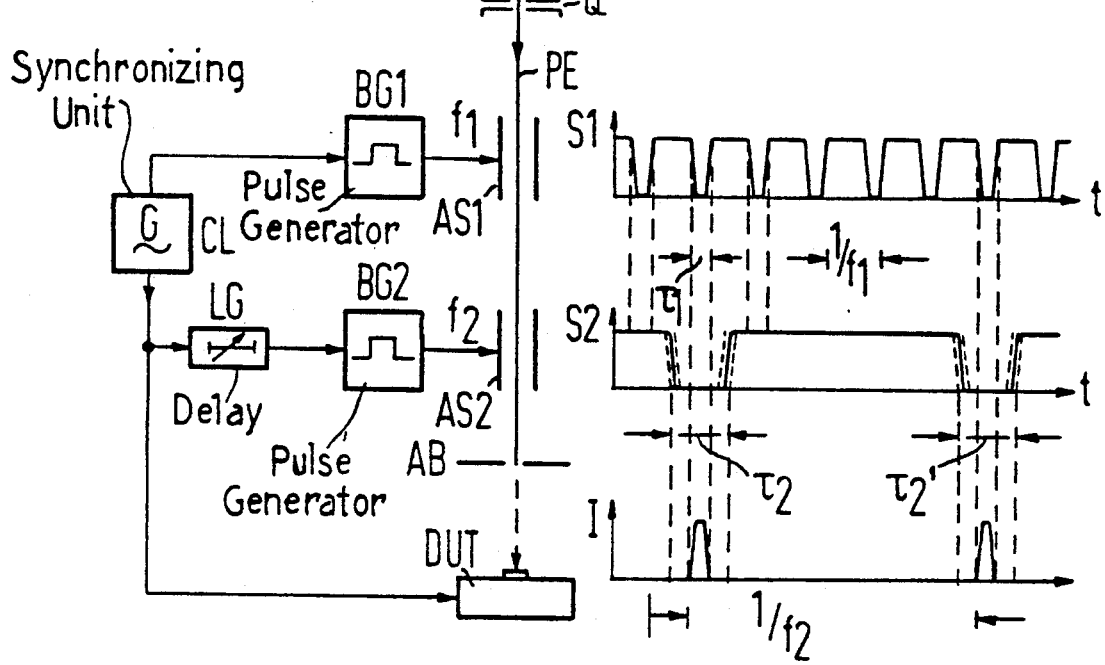
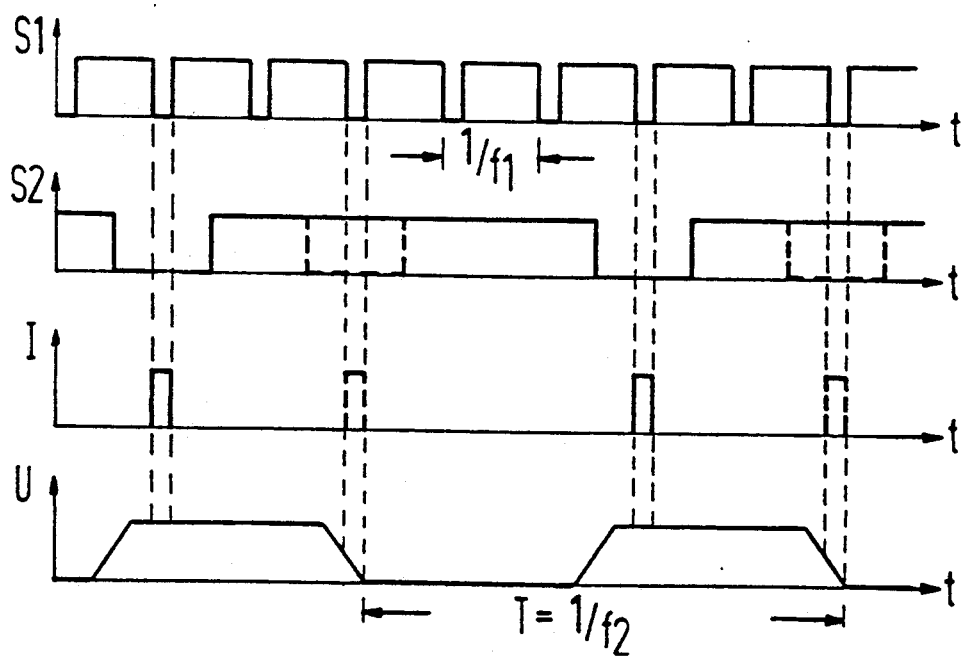

APPARATUS FOR MODULATING A PARTICLE BEAM INTENSITY

This is a continuation of application Ser. No. 186,040 filed Apr. 25, 1988.

BACKGROUND OF THE INVENTION

1. Field of the Invention

The present invention is directed generally to an apparatus for modulating the intensity of a particle beam.

2. Description of the Related Art

A beam blanking system for pulsing an electron beam is disclosed in Rev. Sci. Instrum. 56 (4) April 1985, pages 567 through 571. Beam blanking systems are used in modified scanning electron microscopes and in electron beam testers for, among other things, stroboscopic measurement of high frequency electrical signals in components of microelectronics, such as VLSI circuits. The sampling method is known for use in electron beam testing, see, for example, Microelectronic Engineering, Volume 4, No. 2, 1986, pages 77 through 106 and Volume 5, 1986, pages 523 through 530. To completely measures the time dependency of the signals appearing at interconnects in fast digital circuits by the use of the sampling method, it is often necessary to shift the phase relationship of the electron pulses over a range of 10 through 100 ns as prescribed by the period duration of the signal. Such electron pulses, which are generated with the assistance of a beam blanking system, have a pulse width of 10 through 300 ps. The phase relation is defined by the point in time of keying.

In conventional electron beam testers, the phase shift is usually performed with the assistance of mechanical extension lines, or delay lines, that guarantee a time stable, consistant delay of the trigger signal driving the pulse generator of the beam blanking system. Mechanical phase shifters, however, have the disadvantage that extremely long delay lines are required to delay a signal over a range of time from 10 through 100 ns. Moreover, a considerable attenuation of the trigger signal occurs during the use of long delay lines which results in a noticeable diminution of the phase stability of the arrangement, also known as jitter, that influences the chronological resolution. Furthermore, it is not possible to suddenly discontinuously change the phase relationship of the electron pulses since the length of the extension lines can only be continuously modified.

The use of electronic delay elements for delaying the trigger signal does not come into consideration since these devices do not exhibit the time stability required for measurements of fast digital circuits.

SUMMARY OF THE INVENTION

An object of the present invention is to provide a highly time stable phase shift in an apparatus for modulating the intensity of a particle beam for use in stroboscopic measurements. This and other objects are inventively achieved in an apparatus having first and second modulating means for the particle beam, a synchronizing unit for driving the first and second modulating means and a time delay element preceeding the second modulating means which controllably delays the synchronizing signal to the second modulating means.

An advantage obtainable with the present invention is that signals in fast digital circuits can be measured with a high chronological resolution. In preferred developments and improvements of the invention, the first modulating means is a first intensity modulator driven with a first frequency signal from a first signal generator. The second modulating means is a second intensity modulator driven by a second frequency signal from a second signal generator. The first and second intensity modulators are preferably beam blanking systems which are either formed as a deflecting capacitor and diaphragm or as a traveling wave structure and diaphragm. It is also possible that the intensity modulator be provided by an electro-acoustical element or an electro-optical element. In a further development, the means for modulating the intensity of the particle beam is a particle beam source which is pulsed with a first frequency. In one development, the synchronizing unit is an oscillator. Preferably, the first and second frequencies correspond to the frequency of the signal appearing on the specimen to be tested. For purposes of the present invention, the term "particles" includes both particles that have mass and massless particles, so that charged particles having mass such as electrons and massless particles such as photons are encompassed by such term.

BRIEF DESCRIPTION OF THE DRAWINGS

FIG. 1a is a schematic diagram of an apparatus for pulsing an electron beam according to the principles of the present invention;

FIG. 1b is a group of signal diagrams of signals for application to the various elements of the apparatus of FIG. 1;

FIG. 2 is a group of signal diagrams for driving blanking capacitors of the apparatus according to FIG. 1;

DESCRIPTION OF THE PREFERRED EMBODIMENTS

Figure 3:
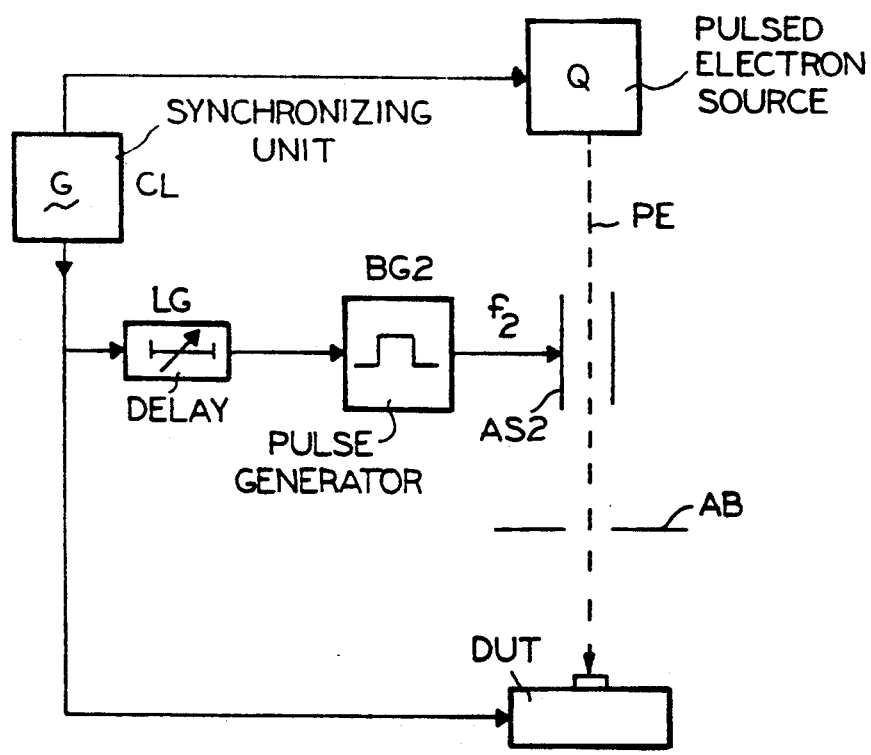
FIG. 3 is a schematic diagram of another embodiment of the invention.

An apparatus shown schematically in FIG. 1 is, in particular, used in electron beam testers, as is known in the art, for pulsing a primary particle beam PE. The apparatus of the present invention is essentially composed of two pulse generators BG1 and BG2 both driven by a synchronizing unit CL. The synchronizing unit CL is, for example, a reference oscillator or clock signal generator. A delay element LG precedes the second pulse generator BG2 and is preferably an electronic time delay element for controllably delaying a trigger signal generated by the synchronizing unit CL. Two blanking capacitors, or plate capacitors, AS1 and AS2 are arranged in the electron-optical column of the electron beam tester between a source Q and a first condenser lens (not shown) to modulate the intensity of the beam PE. The blanking capacitors AS1 and AS2 are charged with output signals S1 and S2 as shown in FIG. 1b, the output signals S1 and S2 being generated by the pulse generators BG1 and BG2, respectively.

Of course, other blanking devices can be used instead of plate capacitors AS1 and AS2. For example, traveling wave structures as disclosed in J. Phys, E: Sci. Instrum., Volume 11, 1978, pages 529 through 532 may be used to modulate the beam PE.

The synchronizing unit CL drives both the pulse generators BG1 and BG2 as well as a component DUT under test which is, for example, a fast digital circuit.

This guarantees that the primary electron pulses are always gated synchronously with internal signals U (shown in FIG. 2) to be measured in the component DUT. The component DUT is introduced into an evacuated specimen chamber (not shown) in the electron beam tester into which electrons PE are directed, as is known in the art.

Referring to the time diagrams of FIG. 1b, the electrons PE emitted from the source Q only reach the component DUT when the electrons traverse the blanking capacitors AS1 and AS2 during time intervals $\tau_2$ or, respectively, $\tau_{2'}$, where $\tau_2 = \tau_{2'} \approx 0.5$ ns. At all other times t, the electrons PE experience such a great deflection in the electrical field of the plate pairs of the capacitors AS1 and AS2 that they impinge a diaphragm AB which is disposed in the beam path following the blanking capacitors AS1 and AS2. A primary electron current I(t) pulsed with a frequency $f_2$ of the signal S2 is observed on the specimen DUT. This primary electron current I(t) exhibits the time dependency as shown schematically in the lower diagram of FIG. 1b.

During stroboscopic measurements, the lower blanking capacitor AS2 is driven with the frequency $f_2$ of, for example, 10 MHz of the signal U adjacent to an interconnect on the specimen DUT, so that only one electron pulse reaches the surface of the module DUT per period $T = 1/f_2$. The electron pulse has a width $\tau_p \approx \tau_1 \approx 10$ ps defining the chronological resolution which is thereby exclusively determined by the upper blanking capacitor AS1 charged with the signal S1 having the frequency $f_1$ of, for example, 10 GHz. In order to vary the phase relationship of the primary electron pulses relative to the signal U to be sampled, the trigger signal of the synchronizing unit CL driving the pulse generator BG2 is delayed by the use of the electronic time delay element LG by a time corresponding to the phase variation.

As shown in FIG. 2, the delay of the trigger signal from the synchronizing unit CL leads to a phase shift between the signals S1 or S2 applied to the blanking capacitors AS1 and AS2, so that the electron pulses no longer sample the plateau of the signal U applied to the interconnect (see the lower diagram of FIG. 2) but sample its trailing edge (see the diagram portions in broken outline). For a frequency of $f_1 = 10$ GHz and $f_2 = 10$ MHz, thus, a time range of 10 ms can be registered in steps of 10 ps.

The phase stability of this present system is defined only by the time stability of the signal S1 applied to the blanking capacitor AS1. Conventional electronic time delay elements LG can therefore be used for delaying the trigger signal, since their phase and stability, or jitter, no longer has a disturbing influence given the pulse width of the signal S2 amounting to, for example, $\tau_2 \approx 0.5$ ns (see the middle diagram of FIG. 1b).

Figure 4:
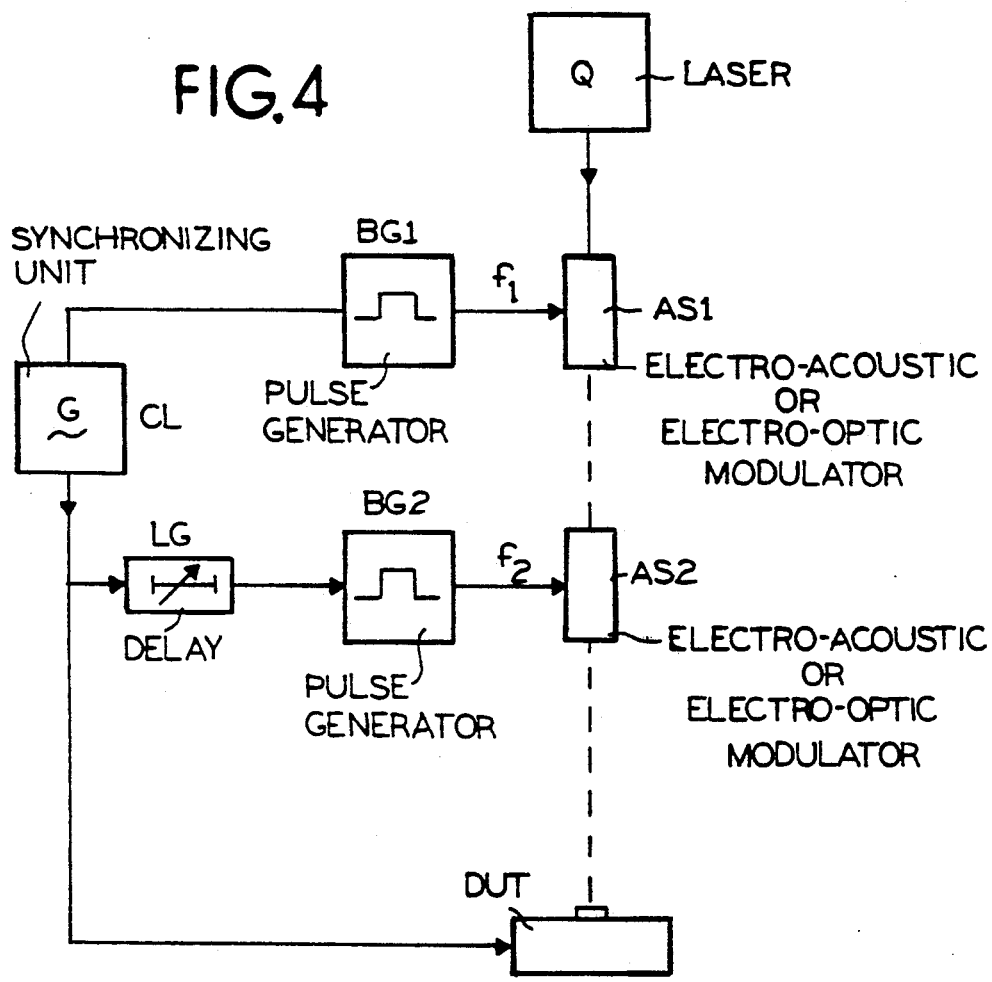
FIG. 4 is a schematic diagram of a further embodiment of the invention.

The invention is of course not limited to the exemplary embodiments as set forth. Thus, it is possible without further ado to transpose the sequence of the blanking capacitors AS1 and AS2 in the beam path or to arrange the blanking capacitor AS2 rotated by 90° in the plane of the blanking capacitor AS1. It is not necessary to introduce an additional diaphragm AB into the beam system of the electron beam tester, as shown in FIG. 4. Beam diaphragms that are ordinarily present in such systems can be used as the diaphragm AB. It is advantageous for the discontinuous variation of the phase relationship of the particle pulses to provide a plurality of time delay elements or delay elements connected parallel and an electronic switch. Smaller time ranges of a signal can be registered with the assistance of a mechanical extension line as hitherto practiced. Moreover, it is possible to shift the keying point in time of the particle pulses that define the phase relationship by modifying the zero voltage of the blanking capacitors. This is particularly advantageous for sampling smaller time ranges such as signal edges.

In a further development, the apparatus of the invention serves the purpose of modulating the intensity of the particle beam and is formed by replacing the pulse generator BG1 and the blanking capacitor AS1 with a source Q pulsed with a frequency $f_1$ as disclosed, for example, in Appl. Phys. Lett., Volume 51, 13 June 1987, pages 145 through 147, and as shown in FIG. 3. As can be seen in FIG. 3, the synchronization unit CL directly drives the source Q so that the primary particle beam PE is pulsed with a frequency $F_1$. The output of the synchronization unit CL also drives the pulse generator BG2 through the delay unit LG.

The invention can be used in an optical scanning microscope (scanning laser microscope) for pulsing the primary beam. The blanking capacitors AS1 and AS2 act as intensity modulators when they are replaced by acousto-optical or, electro-optical elements, such as Pockels cells, as shown in FIG. 4. In the embodiment of FIG. 4, the source Q is a laser, the output of which passes through electro acoustical or electro optical elements AS1 and AS2 before impinging the unit under test DUT. The electro acoustical or electro optical units AS1 and AS2 are driven at the frequencies $S_1$ and $S_2$ similar to that shown in FIG. 1.

Thus, there is provided an apparatus within its preferred development, synchronized first and second beam blanking systems that operated at two different frequencies, one of the frequencies being the other frequency plus a delay. The effect is that the delayed frequency beam blanking system is to open a window through which the narrower higher frequency blanked beam pulse passes. The higher frequency signal controls the pulse position or phase so that a less accurate delay is required of the system for the delayed signal.

Although other modifications and changes may be suggested by those skilled in the art, it is the intention of the inventor to embody within the patent warranted hereon all changes and modifications as reasonably and properly come within the scope of his contribution to the art.

I claim:

1. An apparatus for modulating intensity of a particle beam, comprising:
   a particle beam source;
   first means for modulating the intensity of the particle beam with a first frequency;
   second means for modulating the intensity of the particle beam with a second frequency wherein said first frequency is unequal to said second frequency;
   a synchronization unit driving said first and second means with a synchronization signal; and
   a time-delay element connected between said synchronization unit and said second means to controllably delay said synchronization signal to said second means for modulating relative to said synchronization signal to said first means for modulating.

2. An apparatus as claimed in claim 1, wherein said first means comprises:
   a first intensity modulator for said particle beam, and a first signal generator driving said first intensity modulator with a signal having said first frequency.

3. An apparatus as claimed in claim 1, wherein said second means comprises:
   a second intensity modulator for said particle beam, and
   a second signal generator driving said second intensity modulator with a signal having said second frequency.

4. An apparatus as claimed in claim 1, further comprising:
   a beam blanking system forming at least one of said first and second means.

5. An apparatus as claimed in claim 4, wherein said beam blanking system comprises a deflecting capacitor and a diaphragm.

6. An apparatus as claimed in claim 4, wherein said beam blanking system comprises a travelling wave structure and a diaphragm.

7. An apparatus as claimed in claim 1, further comprising:
   an acousto-optical element forming at least one of said first and second means.

8. An apparatus as claimed in claim 1, further comprising:
   an electro-optical element forming at least one of said first and second means.

9. An apparatus as claimed in claim 1, wherein one of said first and second means for modulating the intensity of the particle beam is a means for pulsing said particle beam source with a first frequency.

10. An apparatus as claimed in claim 1, wherein said synchronizing unit is an oscillator.

11. An apparatus as claimed in claim 1, further comprising: means for connecting at least one of said first and second frequency to a specimen to be tested.

12. An apparatus as claimed in claim 1, wherein said second frequency is lower than said first frequency and said second frequency is substantially equal to a frequency of a signal in a specimen.

13. An apparatus for modulating the intensity of a particle beam, comprising:
   a particle source for generating a particle beam whose intensity is modulated with a first frequency;
   means for modulating the intensity of the particle beam with a second frequency wherein said second frequency is unequal to said first frequency;
   a synchronizing unit connected to drive said particle source and said means for modulating with a synchronization signal, and
   a delay element connected between said synchronizing unit and said means for modulating to adjustably delay said synchronization signal to said means for modulating relative to said synchronization signal to said particle source.

14. An apparatus as claimed in claim 13, wherein said means for modulating includes a deflection unit and a diaphragm arranged in a beam path.

15. An apparatus as claimed in claim 13, wherein said second frequency is lower than said first frequency and said second frequency is substantially equal to a frequency of a signal in a specimen.

16. An apparatus for modulating the frequency of a particle beam, comprising:
   a particle beam source producing a particle beam;
   a first means for periodically deflecting said particle beam from said particle beam source with a first frequency;
   a second means for periodically deflecting said particle beam with a second frequency wherein said second frequency is unequal to said first frequency;
   a diaphragm arranged in a beam path of said particle beam after said first and second means;
   a synchronizing unit having an output connected to drive said first and second means with a synchronizing signal; and
   a delay element connected between said synchronization unit and said second means to adjustably delay said synchronizing signal supplied to said second means relative said synchronizing signal supplied to said first means.

* * * * *